United States Patent

Sumikawa (10) Patent No.: US 7,024,645 B2
(45) Date of Patent: Apr. 4, 2006

(54) METHOD FOR PREDICTING PERFORMANCE OF INTEGRATED CIRCUIT AND METHOD FOR DESIGNING THE CIRCUIT

(75) Inventor: Takashi Sumikawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 282 days.

(21) Appl. No.: 10/627,641

(22) Filed: Jul. 28, 2003

(65) Prior Publication Data

US 2004/0133412 A1 Jul. 8, 2004

(30) Foreign Application Priority Data

Jan. 8, 2003 (JP) ............... 2003-001829

(51) Int. Cl.
G06F 17/50 (2006.01)

(52) U.S. Cl. ............... 716/5; 716/1; 716/4; 716/6
(58) Field of Classification Search ............... 716/1, 716/5, 6, 4; 714/732
See application file for complete search history.

(56) References Cited

U.S. PATENT DOCUMENTS

2002/0133772 A1* 9/2002 Voorakaranam et al. .... 714/732

FOREIGN PATENT DOCUMENTS

JP  10-284606  10/1998

* cited by examiner

Primary Examiner—Thuan Do
(74) Attorney, Agent, or Firm—McDermott Will & Emery LLP (57) ABSTRACT

From a trend for performance correlation coefficients (M1, M2) between circuits of the same type and of different process generations, a performance correlation coefficient M between a current generation circuit and a next generation circuit is predicted, and from a trend for performance correlation coefficients (R1, R2, R3) between circuits of the same process generation and of different types, a performance correlation coefficient R between different types of circuits in accordance with a next generation process is predicted. Thus, based on known performance of a circuit A, performances of a next generation circuits AA and BB are predicted using the predicted performance correlation coefficients M and R.

6 Claims, 7 Drawing Sheets

METHOD FOR PREDICTING PERFORMANCE OF INTEGRATED CIRCUIT AND METHOD FOR DESIGNING THE CIRCUIT

BACKGROUND OF THE INVENTION

The present invention related to performance prediction methods for predicting in an early stage of development performance of an integrated circuit which is intended to be developed and methods for designing the integrated circuit.

In recent years, there have been increased level of fine, very large scale and high performance integrated circuits and systems including such integrated circuits. Performance prediction techniques are of a development process which is used across both of designing and manufacturing processes. For example, performance prediction techniques are used when a design engineer predicts circuit performance from a preliminary designing process specification in an early stage of development and also when a manufacturing process engineer predicts manufacturing process conditions to achieve required circuit performance. Purposes of performance prediction techniques are to seek an optimum combination of conditions for both of designing and manufacturing processes and to make it clear at an early stage whether required performance can be possibly achieved and then give a clear direction for development.

As a known performance prediction technique, there has been disclosed in Japanese Unexamined Patent Publication No. 10-284606 a performance prediction technique, in which a logic circuit is hierarchically represented by model equations, values are input into input variants of the model equations related to each other, calculations are performed, and then predicted values of circuit performance can be obtained. In the performance prediction technique, conditions for designing and manufacturing processes can be represented as parameters in a simple manner using model equations and also effects of the conditions on performance of the circuit can be evaluated. However, between integrated circuits of different process generations, it is difficult to associate model equations with each other. Thus, there is a limit to expression of the effects depending on each circuit. Moreover, if a model equation is built for each process generation, a very accurate model equation can be obtained but a large number of process steps are required.

SUMMARY OF THE INVENTION

Therefore, it is an object of the present invention to provide a method for predicting, with a small number of process steps, performance of a next generation circuit using information for performance parameters of existing process generations and to utilize the prediction in designing a circuit.

Then, an inventive method is a method for predicting performance of an integrated circuit in an early stage of development, including the steps of: a first step of obtaining respective performances of different types of first and second circuits in accordance with an existing generation process; a second step of obtaining a performance correlation coefficient between the first and second circuits; and a third step of predicting, using a predicted value or a target value for performance of a third circuit of the same type as that of the first circuit and in accordance with a next generation process and the performance correlation coefficient obtained in the second step, performance of a fourth circuit of the same type as that of the second circuit in accordance with the next generation process.

The method for predicting performance of an integrated circuit may further includes a fourth step of predicting the performance of the third circuit from a trend for performances of the first circuit and a circuit of the same type as that of the first circuit and in accordance with a different existing process generation from that of the first circuit, and a predicted value for the performance of the third circuit which has been obtained in the fourth step may be used in the third step. Moreover, the second step may include a fifth step of predicting a performance correlation coefficient between the third and fourth circuits from a trend for performance correlation coefficients of different existing circuits which are the same types as those of the first and second circuits, respectively, and the performance correlation coefficient predicted in the fifth step may be used in the third step.

Furthermore, another inventive method is a method for predicting performance of an integrated circuit in an early stage of development, including: a first step of obtaining performance of each of old circuits in accordance with multiple existing generation processes; and a second step of predicting performance of a new circuit of the same type as that of the old circuits and in accordance with a next generation process from a trend for performances of the old circuits of the different existing process generations.

DESCRIPTION OF THE PREFERRED EMBODIMENTS

Hereinafter, embodiments of the present invention will be described with reference to the accompanying drawings.

Figure 1:
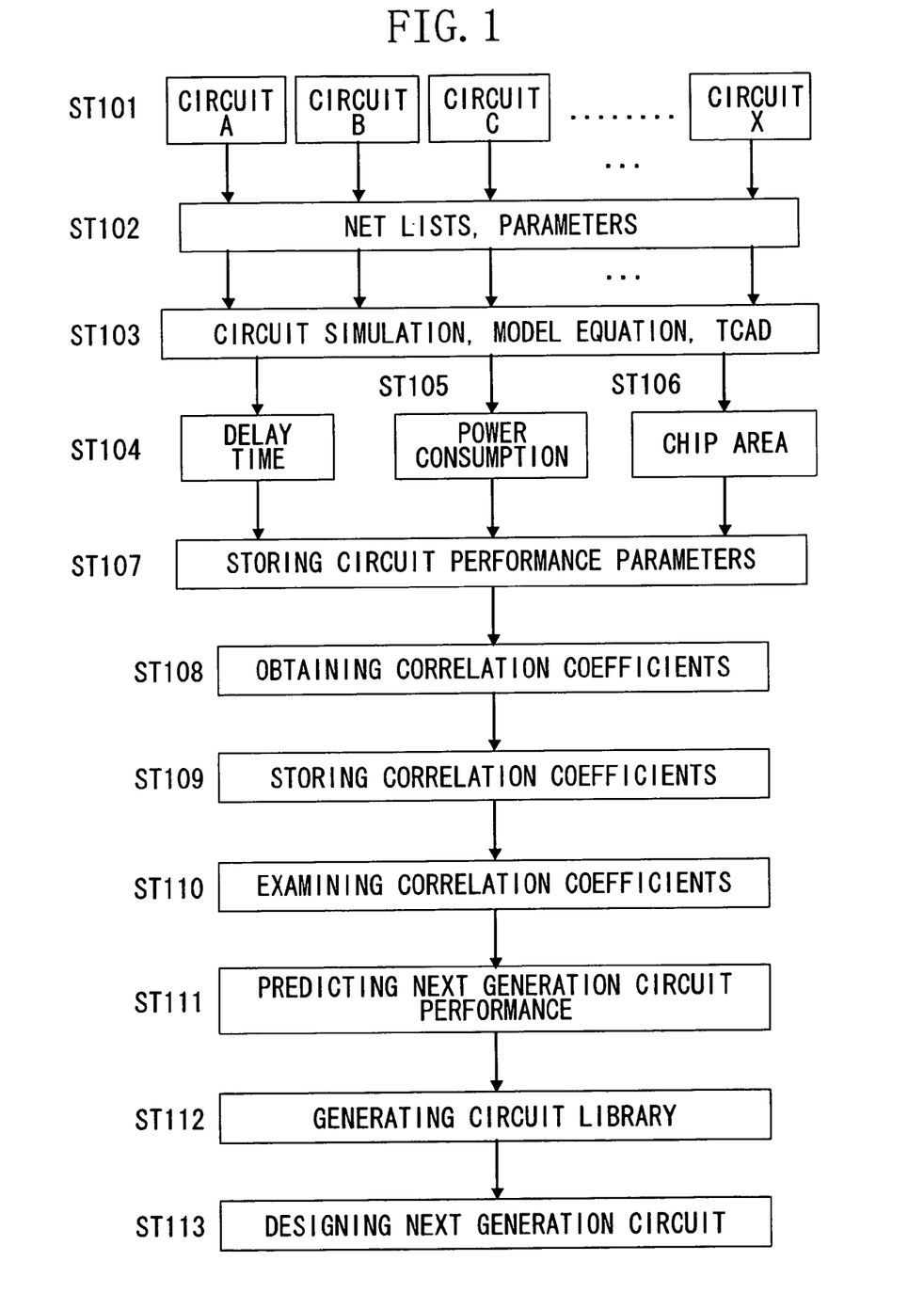
FIG. 1 is a flowchart illustrating an embodiment of a method for predicting an integrated circuit performance and designing an integrated circuit in accordance with the present invention.

FIG. 1 illustrates an embodiment of a method for predicting performance of an integrated circuit and designing the integrated circuit in accordance with the present invention. As shown in FIG. 1, layout information for an existing circuit including almost the same elements as those of a circuit intended to be designed according to a next generation process is prepared in Step ST101. The circuits A through X to be prepared are different to each other. For example, there are cases where the circuit A is an inverter, the circuit B is a two-input NAND gate, the circuit C is a two-input NOR gate, the circuit X is a critical path in an MPU, and where the circuit A is a critical path in an MPU, the circuit B is a critical path in the data path in a DSP, the circuit C is a critical path of an SRAM in an MPU, the circuit X is an inverter. Note that the number of circuits is arbitrary and may be changed as necessary.

In Step ST102, net-lists of the above-described circuits are extracted and then, using circuit simulations, model equations or TCAD (Technology Computer Aided Design), delay time, power consumption, and chip area are obtained for the respective circuits in Step ST104, Step ST105, and Step ST106. The delay time, the power consumption, and the chip area of each of the circuits are the most important elements in predicting performance of an integrated circuit. Synopsys Star-Hspice, Silvaco SmartSpice or the like as circuit simulations, the technique that is above-described and is disclosed in Japanese Unexamined Patent Publication No. 10-284606, BACPAC (Berkeley Advanced Chip Performance Calculator), GTX (The GSRC Technology Extrapolation System) or the like as model equations, and Selete Shamp or the like as TCAD are applicable.

In Step ST107, values for delay time, power consumption, and chip area are collected for each process generation and then those performance parameter values are stored in a storage.

Figure 2:
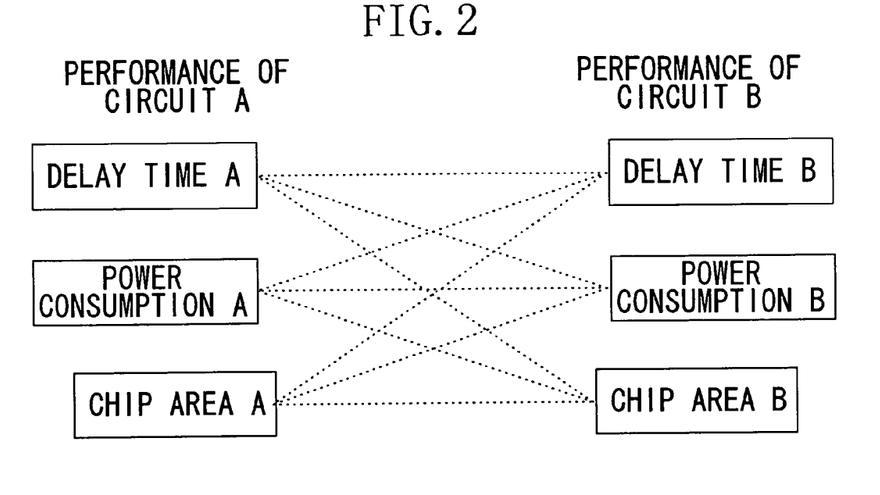
FIG. 2 is a diagram describing the definition of the correlation coefficients between circuit performances used in the performance prediction method of FIG. 1.

In Step ST108, based on the circuit performance parameter values, correlation coefficients between circuit performances are obtained. For example, based on the performance parameter values of the circuit A and the circuit B, the correlation coefficients for delay time, power consumption and chip area between the circuits is obtained and then the correlation coefficients are stored in the storage in Step ST109. As shown in FIG. 2, the correlation coefficients can be defined by arbitrarily combining the circuit performance parameters. Combinations of the performance parameters are, for example, the delay times of the circuit A and the circuit B, the delay time of the circuit A and the power consumption of the circuit B, and the chip area of the circuit A and the delay time of the circuit B, and the like.

Figure 3:
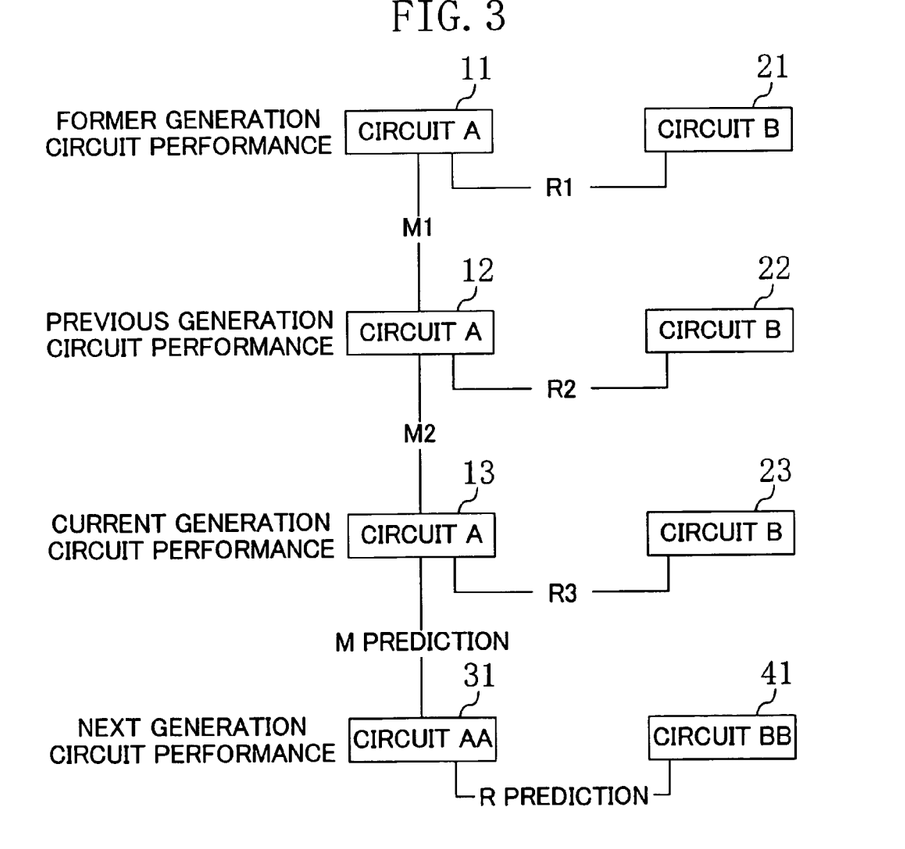
FIG. 3 is a diagram illustrating a specific example of correlation coefficients used in the performance prediction method of FIG. 1.

A specific example of the correlation coefficients between the circuit performances obtained in Step ST108 will be described with reference to FIG. 3. In this case, assuming that circuits A and a circuit AA are inverters and circuits B and a circuit BB are two-input NAND gates, the correlation coefficients for delay time between these circuits are described. In FIG. 3, the reference numerals 11 and 21 indicate an inverter and a two-input NAND gate in accordance with the former generation process, the reference numerals 12 and 22 indicate an inverter and a two-input NAND gate in accordance with the previous generation process, and the reference numerals 13 and 23 indicate an inverter and a two input NAND gate in accordance with the current generation process, and the reference numerals 31 and 41 indicate an inverter and a two-input NAND gate in accordance with the next generation process. In this case, performance correlation coefficients between different types of circuits in accordance with the same generation process R1 [former generation], R2 [previous generation], R3 [current generation], and R [next generation] are expressed by:

$R1$=(delay time of circuit 21)/(delay time of circuit 11)

$R2$=(delay time of circuit 22)/(delay time of circuit 12)

$R3$=(delay time of circuit 23)/(delay time of circuit 13)

$R$=(delay time of circuit 41)/(delay time of circuit 31)

Furthermore, performance correlation coefficients between circuits of the same type and in accordance with different generation processes M1 [former generation: previous generation], M2 [previous generation: current generation] and M [current generation: next generation] are expressed by:

$M1$=(delay time of circuit 12)/(delay time of circuit 11)

$M2$=(delay time of circuit 13)/(delay time of circuit 12)

$M$=(delay time of circuit 31)/(delay time of circuit 13)

Among these coefficients, R1, R2, R3, M1 and M2 are obtained in Step ST108 and stored in the storage in Step ST109. R and M are coefficients that are to be predicted.

Figure 4:
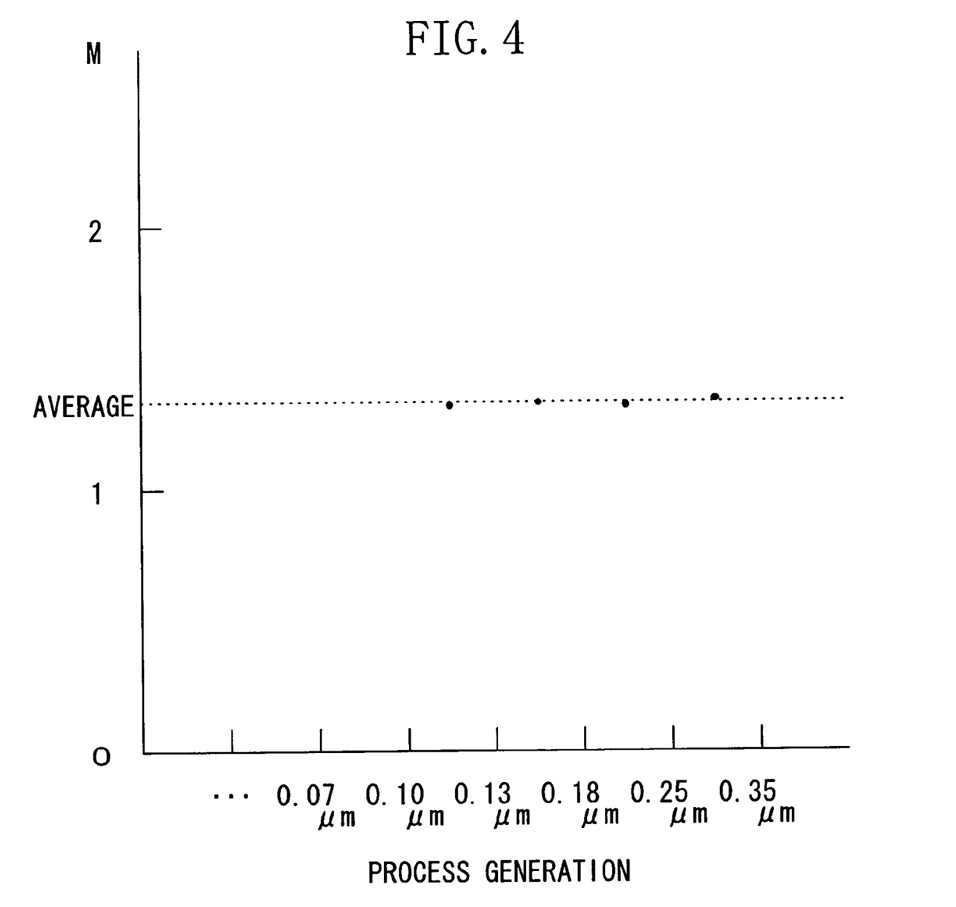
FIG. 4 is a graph showing an example of performance prediction for a next generation circuit when performance correlation coefficients of different processes are almost constant in the performance prediction method of FIG. 1.
Figure 6:
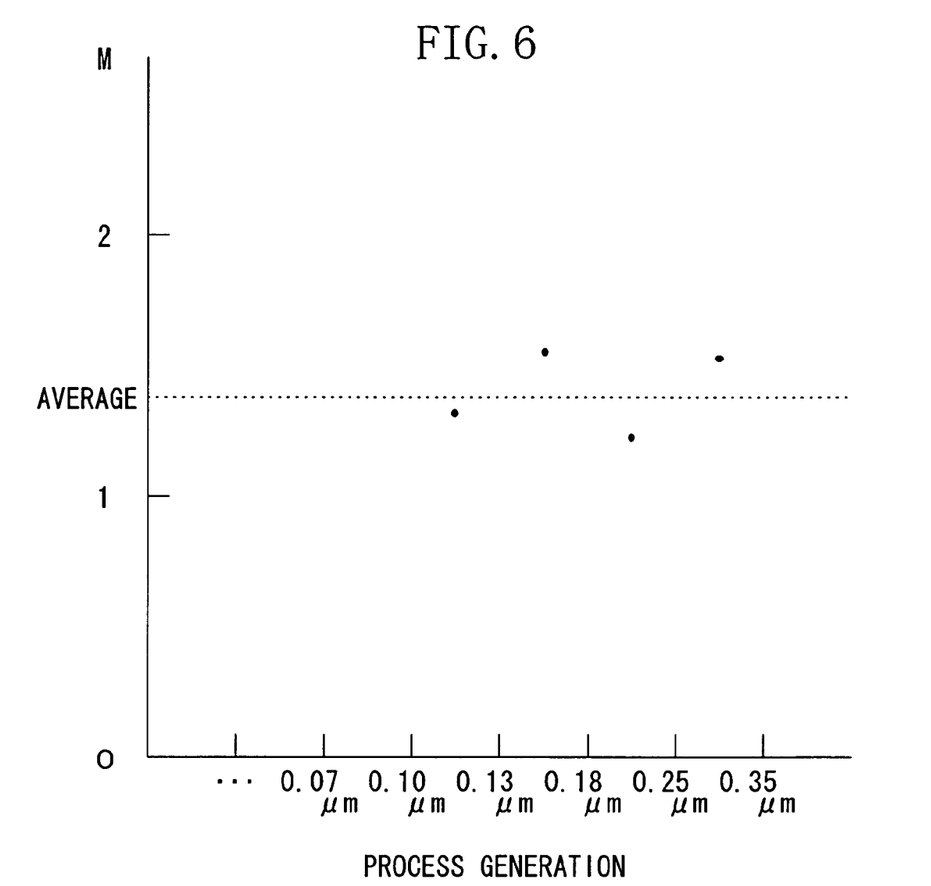
FIG. 6 is a graph showing an example of performance prediction for the next generation circuit when performance correlation coefficients of different processes scatter in the performance prediction method of FIG. 1.

In Step ST110, the known performance correlation coefficients, M1 and M2 in FIG. 3, between process generations are examined and an unknown performance correlation coefficient M is predicted. When performance correlation coefficients between different process generations are almost constant as shown in FIG. 4, the average of the performance correlation coefficients is M. When the performance correlation coefficients between different process generations monotonously increase or decrease, an approximate curve is derived to predict M. When the performance correlation coefficients of different process generations vary as shown in FIG. 6, the average of the performance correlation coefficients may be M. In the same manner, an unknown performance correlation coefficient R is predicted from the known performance correlation coefficients, R1, R2 and R3 in FIG. 3, between different types of circuits.

In Step ST111, performance of a next generation circuit is predicted. In the example of FIG. 3, using the performance correlation coefficient M between different process generations, which has been predicted in Step ST110, from the following equation:

(delay time of circuit 31)=(delay time of circuit 13)×$M$ performance of the next generation circuit AA is predicted first. Furthermore, using the performance correlation coefficient R between different types of circuits, which has been predicted in Step ST110, from the following equation:

(delay time of circuit 41)=(delay time of circuit 31)×$R$ performance of the next generation circuit BB is predicted.

As for next generation circuits corresponding to the other circuits C through X, respective performances can be predicted in the same manner as described.

In Step ST112, based on the next generation circuit performances which have been predicted in Step ST111, using existing process libraries, a circuit library for a next generation process is generated. For example, a circuit library such as a delay library or a power consumption library of the next generation process can be generated by multiplying a value for parasitic capacitance in a library of the previous process by the performance correlation coefficient. The generated circuit library can be used for a logic simulation.

In Step ST113, based on the circuit library of Step ST112, a circuit design using a next generation process is performed.

According to the above-described method for predicting performance of an integrated circuit and designing the circuit, performance of a next generation circuit can be predicted using only performance information for circuits in accordance with exiting processes. Moreover, in the method, a trend for the performance correlation coefficients between different types of circuits is used, and thus prediction results with high accuracy can be obtained for the performance correlation coefficient R.

Figure 5:
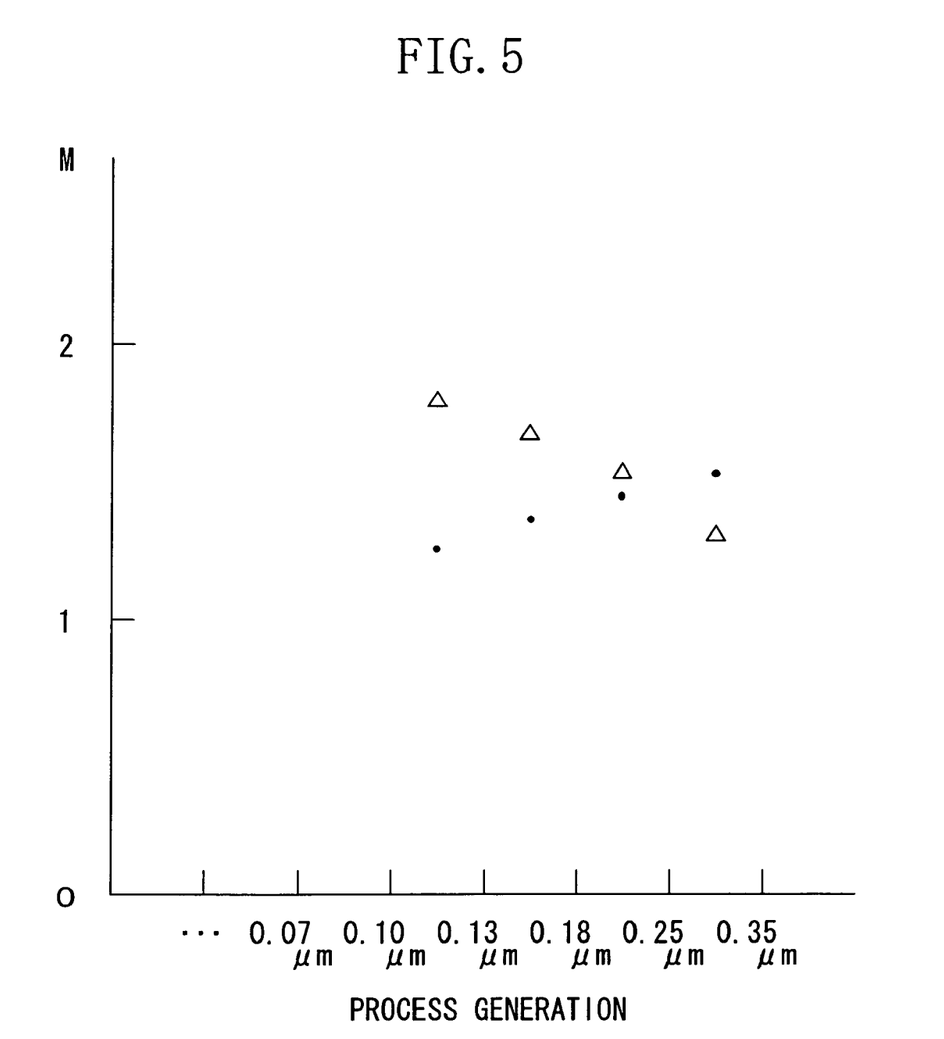
FIG. 5 is a graph showing an example of performance prediction for the next generation circuit when performance correlation coefficients of different processes show a monotonous increase or decrease in the performance prediction method of FIG. 1.

Note that when trends shown in FIGS. 4 through 6 for the performance correlation coefficients between different process generations are not obtained, a target value for performance of the next generation circuit AA is set in advance and then performance of the next generation circuit BB can be predicted using the performance correlation coefficient R between different types of circuits. Moreover, when it is understood in advance that the performance correlation coefficient R between different types of circuits does not depend on process generations and is almost constant, R1, R2 or R3 is adopted as R and then performance of the next generation circuit BB can be predicted using this R.

Figure 7:
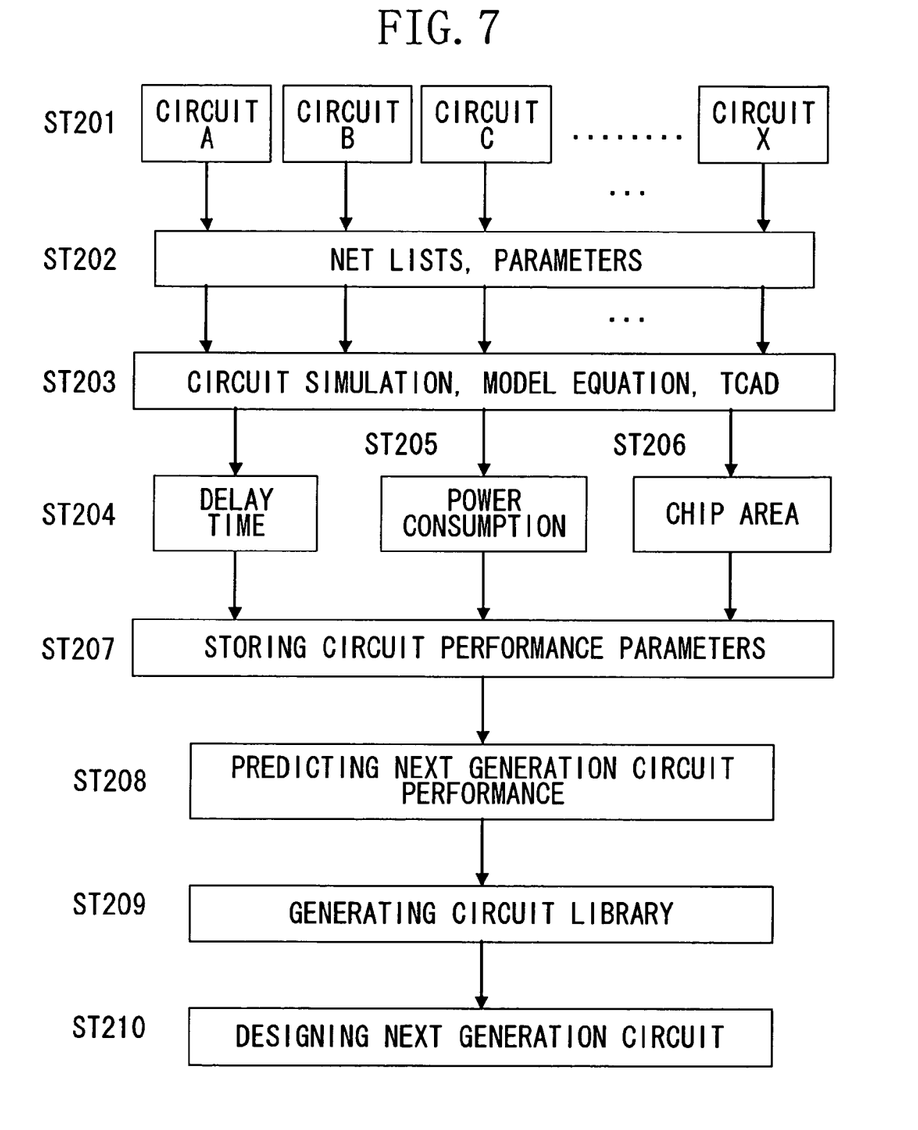
FIG. 7 is a flowchart illustrating an embodiment of a method for predicting an integrated circuit performance and designing an integrated circuit in accordance with the present invention.
Figure 8:
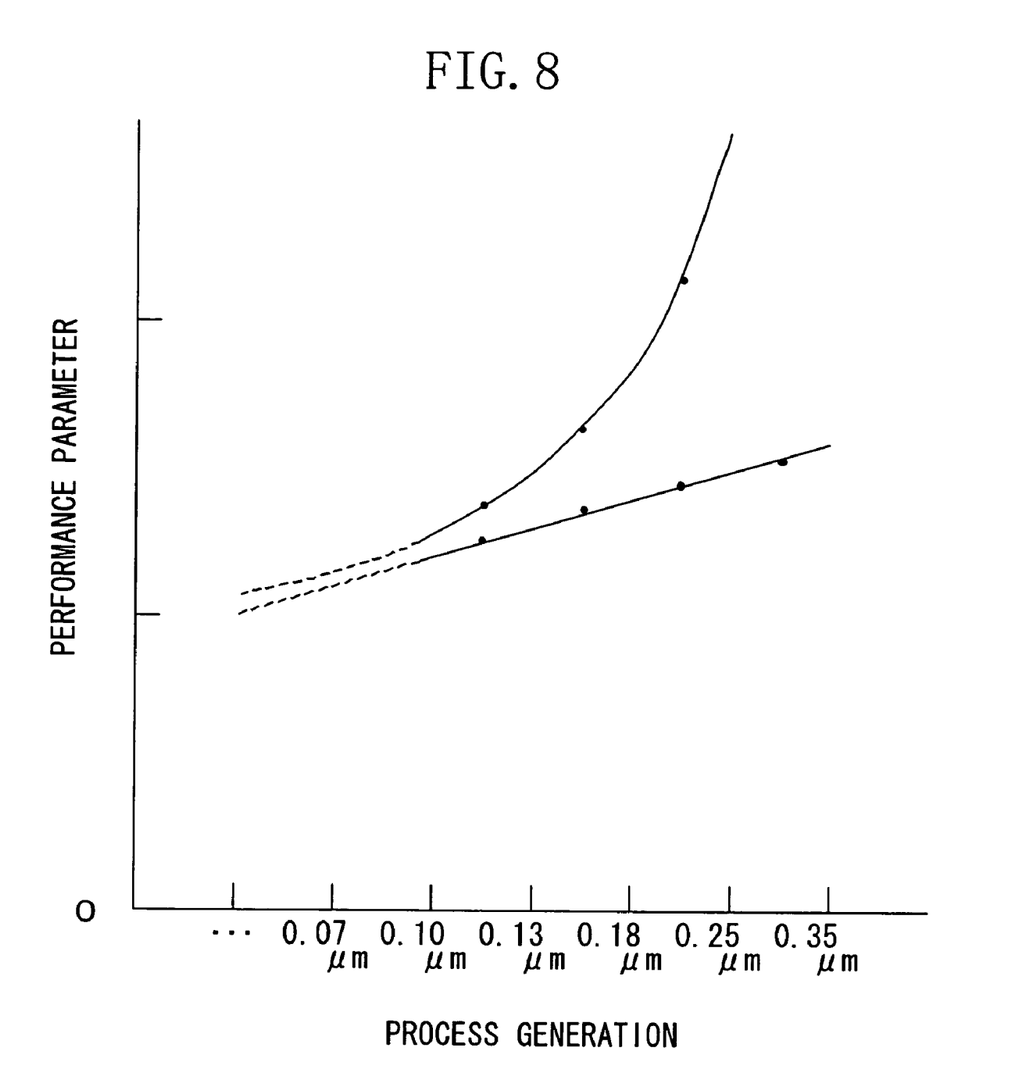
FIG. 8 is a graph showing an example of performance prediction for a next generation circuit in the performance prediction method of FIG. 7.

FIG. 7 illustrates another embodiment of a method for predicting performance of an integrated circuit and designing the integrated circuit in accordance with the present invention. In FIG. 7, Steps ST201 through ST207 are equivalent to Steps ST101 through ST107 in FIG. 1. In Step ST208, performance of a next generation circuit is predicted from performance parameters stored in Step ST207. FIG. 8 is a graph describing the prediction method, and performance parameters of the next generation circuit are predicted from trends for performances of circuits between different process generations. As shown in FIG. 8, performance parameters of the next generation circuit can be predicted from an approximate curve or from an approximate line.

In Step ST209, based on the performance of a next generation circuit, which has been predicted in Step ST208, using existing process libraries, a circuit library for the next generation process is generated, for example, by multiplying a value for parasitic capacitance in the library of the previous process by a scaling factor. The next generation circuit library can be used for a logic simulation. In subsequent Step ST210, based on the circuit library of Step ST209, a circuit design using the next generation process is performed.

According to the performance prediction and designing method of FIG. 7, unlike the method of FIG. 1, the performance of the next generation circuit is directly predicted from trends for circuit performances in accordance with existing processes. Thus, performance prediction can be completed in a short time.

Note that in the performance prediction and designing methods of FIGS. 1 and 7, as for all or part of the circuits A through X, an actual wafer or a mounted chip may be prepared, values for the delay time, power consumption, and chip area of the wafer or the chip may be obtained by actual measurements, and then the obtained values may be used for predicting performance of the next generation circuit.

The methods for predicting as performances of a circuit delay time, power consumption and chip area has been described. However, the performance prediction method according to the present invention is not limited to these performances. For example, in the inventive method, the yield of a circuit can be evaluated.

What is claimed is:

1. A method for predicting performance of an integrated circuit in an early stage of development, comprising:
    a first step of obtaining performance of a first circuit, and obtaining performance of a second circuit which is a different circuit from the first circuit, the first and the second circuits being made by an existing generation process;
    a second step of obtaining a performance correlation coefficient between the first circuit and the second circuit; and
    using a predicted value or a target value for performance of a third circuit which is the same type as the first circuit and made by a next generation process, and the performance correlation coefficient obtained in the second step, a third step of predicting performance of a fourth circuit which is the same type as the second circuit and made by the next generation process,
    wherein at least one of delay time, power consumption and chip area of each of the circuits is used as the performance.

2. The method for predicting performance of an integrated circuit of claim 1, further comprising a fourth step of predicting the performance of the third circuit from a trend for performances of the first circuit and a circuit of the same type as that of the first circuit and in accordance with a different existing process generation from that of the first circuit,
    wherein a predicted value for the performance of the third circuit which has been obtained in the fourth step is used in the third step.

3. The method for predicting performance of an integrated circuit of claim 1, wherein the second step includes a fifth step of predicting a performance correlation coefficient between the third and fourth circuits from a trend for performance correlation coefficients of different existing circuits which are the same types as those of the first and second circuits, respectively, and
    the performance correlation coefficient predicted in the fifth step is used in the third step.

4. The method for predicting performance of an integrated circuit of claim 1, wherein performance of all or part of existing circuits are obtained using simulations, model equations or TCAD (Technology Computer Aided Design).

5. The method for predicting performance of an integrated circuit of claim 1, wherein performance of all or part of existing circuits are obtained using actual measurement.

6. A method for designing an integrated circuit, comprising the steps of:
    generating a circuit library for a next generation process from prediction results obtained in the method for predicting performance of an integrated circuit of claim 1; and
    performing circuit design based on the generated circuit library using the next generation process.

* * * * *